United States Patent

Burns

[15] 3,663,820

[45] May 16, 1972

[54] DIODE ARRAY RADIATION RESPONSIVE DEVICE

[72] Inventor: Joseph Burns, Pequannock, N.J.

[73] Assignee: Fairchild Camera and Instrument Corporation, Mountain View, Calif.

[22] Filed: Oct. 7, 1970

[21] Appl. No.: 78,734

[52] U.S. Cl. ......................250/211 J, 250/213 R, 317/235 N

[51] Int. Cl. ......................H01j 39/12

[58] Field of Search ......................250/211 R, 211 J, 213; 307/311; 317/235 N

[56] References Cited

UNITED STATES PATENTS

| | | | |
|---|---|---|---|
| 3,440,477 | 4/1969 | Crowell | 315/11 |
| 3,467,880 | 9/1969 | Crowell | 317/235 N |
| 3,569,758 | 3/1971 | Horiuchi | 317/235 N |
| 3,574,143 | 4/1971 | Vratny | 317/235 N |
| 3,577,175 | 5/1971 | Gri | 317/235 N |

*Primary Examiner*—James W. Lawrence
*Assistant Examiner*—D. C. Nelms
*Attorney*—Roger S. Borovoy and Alan H. MacPherson

[57] ABSTRACT

A silicon wafer has a plurality of spaced diode junctions formed in its upper surface and through openings in a silicon dioxide layer. A conductive grid is disposed over the silicon dioxide layer and has openings exposing the elemental diode surfaces. The top of the exposed diode surfaces are cesiated. Each of the diodes is reverse biased and the cesiated surfaces of the diodes emit electrons, appropriately adjusting their potential in response to radiation applied to the adjacent rear surface of the wafer.

6 Claims, 3 Drawing Figures

INVENTOR.
JOSEPH BURNS
BY Roger S. Borovoy & Alan H. MacPherson
ATTORNEYS

DIODE ARRAY RADIATION RESPONSIVE DEVICE

RELATED APPLICATIONS

My copending application Ser. No. 815,646, filed Apr. 14, 1969, now abandoned, shows the use of a diode array in a scan converter.

BACKGROUND OF THE INVENTION

This invention relates to a diode array which has application in devices for the detection and application of input radiation for subsequent reproduction and presentation of the information contained in the input radiation.

Devices for detection and further processing of radiation are well known and include conventional radiation detectors for detecting radiation over portions of the frequency band from X-ray frequencies to ultraviolet light frequencies, or for detecting only certain bands of those frequencies. Such devices can be used for detection per se, or can be incorporated into other devices, such as image orthicons, vidicons, secondary electron conductive (SEC) devices, and the like. It is known that the radiation sensing element for such devices can consist of an array of semiconductor diode elements, as described, for example, in the article by Alfred Rosenblatt, entitled "Cat's Eyes for the Military", in the issue of Sept. 1, 1969 of "Electronics", pages 64 to 73. It is also known that electron emission can be obtained from a reverse biased diode device in response to input radiation, where the diode is biased to avalanche breakdown, and where the electron-emitting surface of the diode is cesiated to lower its work function, this being taught in U.S. Pat. No. 2,960,659 to J. A. Burton. It is further known that a matrix of conductive elements extending from a photocathode and disposed below a conductive grid can have cesiated electron-emissive surfaces which unite localized electrons in response to localized input radiation.

The present invention provides a novel and improved array in which the diode elements are reverse biased only sufficiently to create an electron collection region at the upper surface of the diodes of the array, and in which the reverse biased electrode mesh on top of the device is applied in a novel manner.

SUMMARY OF THE INVENTION

A diode array is formed in a semiconductor substrate and is formed by diffusion through aligned openings through an insulation layer on top of the substrate and a conductive layer covering the insulation layer. The exposed diode surfaces are then coated with a suitable photocathode. A reverse bias, substantially below the avalanche voltage of the diodes is applied to the diode junctions to produce a collection field for collecting appropriate carriers of electron-hole pairs formed by input radiation. A photon source then illuminates the diode surfaces and a positive field gradient, forming an acceleration field, is applied beyond the conductive grid. Radiation applied to the rear surface of the wafer will then cause electron emission from the emission surface of the device which is generally related in local intensity to the local pattern of the intensity of the input radiation. Output emission will correspond essentially linearly with input modulation, although the diode elements can be designed to deliver a non-linear output. Thus, a radiation image focused on the substrate will produce a graded level, spatially coherent electron output. This output can be focused on a phosphor screen to produce an optical gray scale output, or on some other target such as an ebic or mesh storage target to produce an equivalent electrical output when scanned with an electron beam on or through the opposite target surface, as in a scan converter.

It will be understood that the quantum efficiency of the photodiode array of the invention to input radiation is high due to the low ionization energy required to generate electron-hole pairs in the substrate.

In an alternate construction, the device can be readout by secondary emission collection of electrons produced by a reading gun electron beam wherein, for N-type diodes on a P-type substrate, equilibrium potential is established at collector potential. In the case of P-type diodes in an N-type substrate, the device can be read by a return low-voltage beam for dynode output multiplication.

As a further modification of the invention, the photon source previously described can be replaced by an electron source. Thus, a gain of 2000 can be obtained for a 10 keV energy beam. Such a device would then consist of a spatially coherent electron amplifier stage in a low light level image tube. Other applications of the array of the invention are for a variable time emitter where the photo-excitation level is adjustable; for a MEET disperser in an image dissector tube, and as the storage target of a direct view storage tube in which bias level is adjustable to adjust storage.

DETAILED DESCRIPTION OF PREFERRED EMBODIMENT

Figure 1:
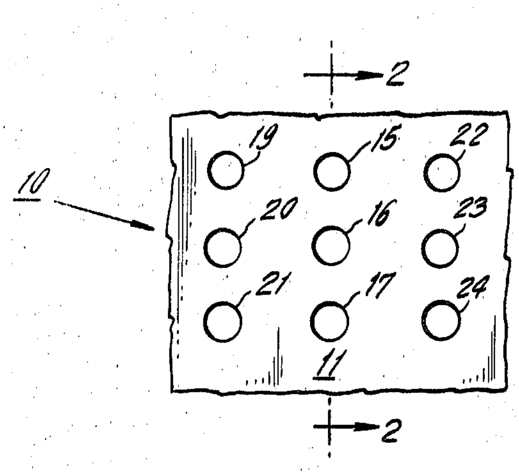
FIG. 1 is a top view of a part of the top of an array constructed in accordance with the invention.
Figure 2:
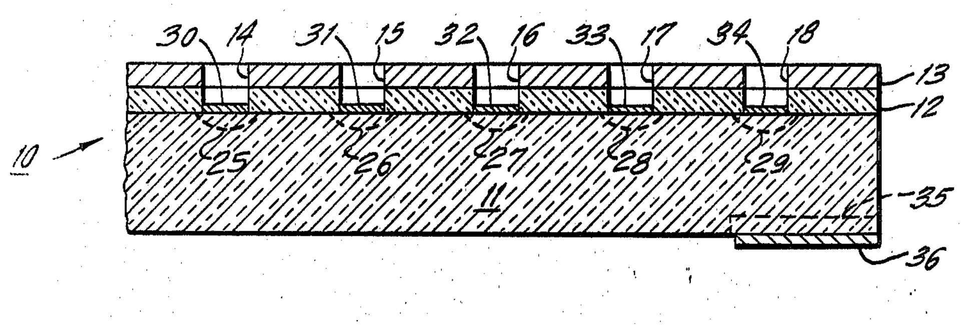
FIG. 2 is a cross-sectional view of FIG. 1 taken across section line 2–2 in FIG. 1.

Referring first to FIGS. 1 and 2, there is shown a diode array 10 which consists of a monocrystalline silicon P-type substrate 11. Other semiconductor substrates can be used. Substrate 11 may have a thickness of about 1 mil, although other thicknesses can be used, with the optimum thickness depending upon the nature of the radiation which is to be detected. A plurality of spaced diodes are then formed in the upper surface of the substrate wherein adjacent diodes may be spaced from one another on one mil centers, thereby to form a diode array having a given number of spaced rows and a given number of diodes per row. By way of example, 1000 rows of 1000 diodes per row could be arranged in a square wafer. Any other diode arrangement could be used such as a circular deployment of the individual diodes.

In forming the diode array, the wafer can be first covered with a thin $SiO_2$ layer 12. Thereafter, and before holes are formed in layer 12, a conductive layer 13 is deposited on top of the upper surface of layer 12, for example, by spray or evaporation techniques. Preferably, layer 13 is of gold, aluminum, or chromium, or some other material which exhibits little photoemission, as compared to the alkali metals.

The top of layer 13 is then suitably masked by conventional photographic techniques with an etch-resistant surface having spaced openings conforming to the desired location of diodes in substrate 11, and openings are etched through layers 12 and 13 to expose the surface of substrate 11. These are shown as openings 14 to 24 in FIGS. 1 and 2. This action forms a mesh of the conductive layer 13. Thereafter, the wafer is cleaned and placed in a suitable diffusion furnace for the diffusion of N-type diodes into the surface regions of substrate 11 exposed by openings 14 to 24. This results in the formation of spaced P-N junctions, such as junctions 25 to 29 (in openings 14 to 18, respectively) in FIG. 2. Thereafter, the surface of conductive mesh 13 is again masked, and the exposed silicon surfaces in openings 14 to 24 are cesiated or photocathodes 30 to 34 (FIG. 2) are deposited on their surface. Thus, while the diodes formed by junctions 25 to 29 are normally photoemissive to infra-red radiation, for example, the emission efficiency is increased and the spectral wavelength peak is reduced by the photocathodes 30 to 34, or by their cesiated surfaces.

Thereafter, the surfaces of the device are appropriately masked and a P+ rim 35 is diffused around the bottom of the device, and a contact 36 is secured to this P+ region. Contacts 36 and 13 may then be provided with suitable leads for connection to control circuits. Thus, a small reverse bias, of the order of 10 volts is applied between electrodes 36 and 13, to apply a reverse biased field across the various P-N junctions defining the diode array. Note that this bias is substantially below the avalanche voltage of any of the individual diodes. This reverse bias produces a high charge collection field across the thin substrate 11.

Figure 3:
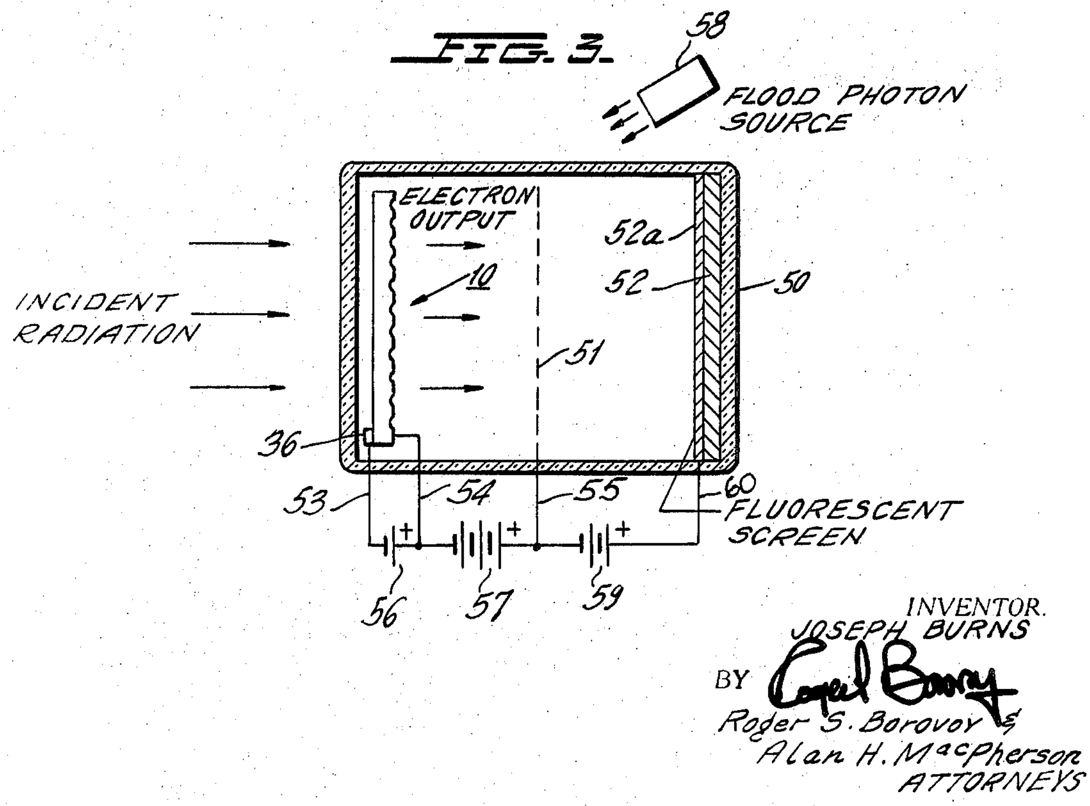
FIG. 3 schematically shows one manner in which the array of FIGS. 1 and 2 can be applied to a radiation detection device.

One typical application for the array of FIGS. 1 and 2 is shown in FIG. 3. Thus, array 10 is suitably mounted within an evacuated transparent envelope 50 with the rear surface of the array (which contains electrode 36) facing a source of incident radiation. An accelerating field source, such as grid 51 is placed within envelope 50 and is spaced from and is coextensive with the upper surface of layer 13. A phosphor screen 52 with metallized surface 52*a* (aluminumized) is then disposed on the side of envelope 50 which faces the array 10 with the screen 52 being observable through envelope 50. Leads 53, 54, 55 and 60 are connected to electrode 36, electrode 13, screen 51 and aluminumized layer 52*a* respectively and are taken through the wall of envelope 50 in an hermetically sealed manner. These leads are connected as shown to voltage source 56 which is about 10 volts, to establish the reverse bias for the individual diodes in wafer 10, to voltage source 57, which is about 1000 volts to establish an accelerating field for electrons emitted from the surface of device 10 and to voltage source 59, which is about 10,000 volts for acceleration and phosphor screen excitation.

A suitable photon source 58, to which the diodes do not respond, is then provided to direct photons toward the device photocathodes, such as photocathodes 30 to 34 in FIG. 2. Photon source 58 provides photons to which these photocathodes are responsive and illuminates the entire photocathode array.

To eliminate the need for focusing elements, the screen 51 and metallized layer 52*a* may be relatively close. For example, screen 51 may be 20 mils from the adjacent surface of array 10, and layer 52*a* may be about 100 mils from screen 51.

The operation of the device of FIG. 3 is as follows:

Electrons will be emitted from the photocathodes until the photo-surface potential rises to an equilibrium potential determined by the potential of batteries 56 and 57, the spacing of grid 51 from electrode 13, the accelerating field penetration into the surface of the device, the exit energy of the photoelectrons, and the contact potential between the grid 13 and substrate 11. Once the photo-surface becomes sufficiently positive, grid 13 cuts off further photoemission.

If now, the rear surface of device 10 is exposed to input radiation, carrier pairs will be generated within the substrate 11 exciting valance band electrons into the conduction band. The extent of carrier pair generation will depend on parameters such as radiation wavelength and intensity, substrate thickness, substrate material, and doping material and concentration. The holes will return to the rear surface while electrons will diffuse to the diode depletion regions in the immediate region of excitation, charging the corresponding individual diodes negatively, from their respective equilibrium potentials, in spatial gray scale correspondence with input photon modulation. The positive gradient created between each diode surface, capacitively coupled to the depletion region, and the grid 13 will enable local photoemission to resume, depending on the incident radiation on the individual diode elements. Thus, output electrons, which can be initially accelerated toward and focused on screen 52 will reproduce the energy modulation in the incident radiation with either or both amplification and conversion of incident radiation to a visible or detectable wavelength or level.

Since the diode array 10 is essentially a linear device, its output emission of electrons will correspond linearly with the input modulation of the incident radiation. Non-linear characteristics could also be achieved. In either case, the image focused on the rear of device 10 will produce a graded level, spatially coherent electron output. This output focused on screen 52 will then produced an optical gray scale visible image of the input radiation.

Note that while FIG. 3 shows the output electron as directed toward a phosphor screen 52, these electrons could be directed toward any target for the production of an optical or electrical output. Thus, screen 52 could be replaced by an ebic or mesh storage target which can be scanned by an electron beam to produce an equivalent electrical output, related to the instantaneous position of the beam as it scans the target. The scanning beam can scan on or through the opposite target surface, as in a scan converter.

The device of FIGS. 1 and 2 will have numerous other applications to particular devices. Thus, the device output can be read-out by secondary emission collection of electrons produced by a reading electron gun beam, rather than a photon source as in FIG. 3. Thus, the reading gun establishes equilibrium potential at the collector potential. Such a device could also use an N-type substrate with P-type regions diffused therein to form the diodes. Read-out would then be obtained by a low voltage return electron beam with dynode output multiplication. As in other devices using the array of the invention, quantum efficiency is high due to the low ionization energy needed to create electron-hole pairs.

A further application of the device of FIGS. 1 and 2 can be made with an electron input replacing the incident radiation. In such a device, a gain of 2000 is possible for a 10 keV energy beam. Thus, the device could define a spatially coherent electron amplifier stage in a low light level image tube. Such a device could also have use as a variable time emitter by adjusting the photo-excitation level, as a MEET disperser in an image dissector; and as a storage target preceding the phosphor screen in a direct view storage tube, with the bias level being adjustable to adjust storage.

Although this invention has been described with respect to particular embodiments, it should be understood that many variations and modifications will now be obvious to those skilled in the art, and, therefore, the scope of this invention is limited not by the specific disclosure herein, but only by the appended claims.

The embodiments of the invention in which an exclusive privilege or property is claimed are defined as follows:

1. A diode array for a radiation-sensitive device; said diode array comprising:

a substrate of semiconductor material of one of the conductivity types, said substrate having flat, continuous parallel first and second outer surfaces;

a plurality of spaced regions of the other of the conductivity types formed in said substrate and extending from said first outer surface of said substrate, thereby to form a corresponding plurality of spaced P-N junctions defining diodes, each terminating on said first outer surface of said substrate, the surfaces of said diodes which extend to said first outer surface being cesiated to increase their emission efficiency and to reduce their spectral wavelength peak;

an electrical insulation layer deposited on said first surface of said substrate;

a continuous conductive layer extending over the upper surface of said insulation layer;

a plurality of openings extending through said insulation layer and said conductive layer to substantially expose at least portions of the regions of said first surface of said substrate which is of the said opposite conductivity type while covering the remaining portions of said first surface of said substrate, thereby to expose said diodes through said openings;

first and second electrical connection means connected to said continuous conductive layer and at least a portion of said second surface respectively for reverse biasing each of said diodes with a voltage below the avalanche breakdown voltage of said diodes.

2. The device of claim 1 wherein said substrate consists of P-type monocrystalline silicon having a thickness of about one mil, and wherein said diodes comprise N-type material diffused into said first surface of said substrate.

3. The device of claim 1 wherein said surfaces of said diodes exposed through said openings have respective photo-emissive layers thereon; said photoemissive layers being insulated from one another; said continuous conductive layer being of a material less photoemissive than the material of said photoemissive layers.

4. The device of claim 1 wherein each of said diodes are on centers spaced from one another by about one mil.

5. The device of claim 2 wherein said surfaces of said diodes exposed through said openings have respective photoemissive layers thereon; said photoemissive layers being insulated from one another; said continuous conductive layer being of a material less photoemissive than the material of said photoemissive layers.

6. The device of claim 5 wherein each of said diodes are on centers spaced from one another by about one mil.

* * * * *